(12) United States Patent
Funyu

(10) Patent No.: US 10,594,321 B1
(45) Date of Patent: Mar. 17, 2020

(54) SEMICONDUCTOR INTEGRATED CIRCUIT AND RECONFIGURABLE SEMICONDUCTOR SYSTEM

(71) Applicants: KABUSHIKI KAISHA TOSHIBA, Tokyo (JP); TOSHIBA ELECTRONIC DEVICES & STORAGE CORPORATION, Tokyo (JP)

(72) Inventor: Masami Funyu, Tokyo (JP)

(73) Assignees: KABUSHIKI KAISHA TOSHIBA, Tokyo (JP); TOSHIBA ELECTRONIC DEVICES & STORAGE CORPORATION, Tokyo (JP)

( * ) Notice: Subject to any disclaimer, the term of this patent is extended or adjusted under 35 U.S.C. 154(b) by 0 days.

(21) Appl. No.: 16/292,167

(22) Filed: Mar. 4, 2019

(30) Foreign Application Priority Data

Sep. 18, 2018 (JP) ................................ 2018-173577

(51) Int. Cl.
*H03K 19/177* (2006.01)
*H03K 19/1776* (2020.01)
*G06F 17/50* (2006.01)
*H03K 19/17728* (2020.01)
*H03K 19/173* (2006.01)

(52) U.S. Cl.
CPC ..... *H03K 19/1776* (2013.01); *G06F 17/5054* (2013.01); *H03K 19/1737* (2013.01); *H03K 19/17728* (2013.01)

(58) Field of Classification Search
CPC .. G01R 31/27; G01R 31/275; G01R 31/2832; G01R 31/2836; G01R 31/2896; G01R 31/317
See application file for complete search history.

(56) References Cited

U.S. PATENT DOCUMENTS

| 5,885,846 | A | * | 3/1999 | Beffa | G01R 31/12 438/18 |
| 9,130,559 | B1 | * | 9/2015 | Ahmad | H03K 19/003 |
| 9,419,624 | B2 | | 8/2016 | Lesea | |

(Continued)

FOREIGN PATENT DOCUMENTS

| JP | H08-298289 A | 11/1996 |
| JP | 2016-63490 A | 4/2016 |

(Continued)

*Primary Examiner* — Jason Crawford
(74) *Attorney, Agent, or Firm* — Kim & Stewart LLP

(57) ABSTRACT

A semiconductor integrated circuit includes a plurality of logic circuits each being configurable to perform a logic function according to configuration data set therein, a memory that stores configuration information for use in setting the configuration data in each of the plurality of logic circuits, a test circuit configured to perform a test for detecting an error in each logic circuit, and an output circuit configured to output information indicating whether the error exists in one or more of the logic circuits based on a result of the test. In response to the output of the information indicating that the error exists, the configuration information stored in the memory is updated with new configuration information for setting the configuration data of each of the logic circuits other than one or more logic circuits having the error.

20 Claims, 3 Drawing Sheets

(56) References Cited

U.S. PATENT DOCUMENTS

| | | |
|---|---|---|
| 9,525,422 B2 | 12/2016 | Oda |
| 9,621,159 B2 | 4/2017 | Oda |
| 2004/0025086 A1* | 2/2004 | Gorday ............... G01R 31/317 |
| | | 714/37 |
| 2016/0154055 A1* | 6/2016 | Leibowitz .......... G01R 31/2896 |
| | | 324/762.03 |
| 2016/0266964 A1* | 9/2016 | Uekusa ............... G06F 11/1004 |
| 2018/0239665 A1* | 8/2018 | Hutton ............... G06F 11/1048 |

FOREIGN PATENT DOCUMENTS

| | | |
|---|---|---|
| JP | 2015-61238 | 12/2016 |
| JP | 2017-535125 A | 11/2017 |
| JP | 2017-536041 A | 11/2017 |

\* cited by examiner

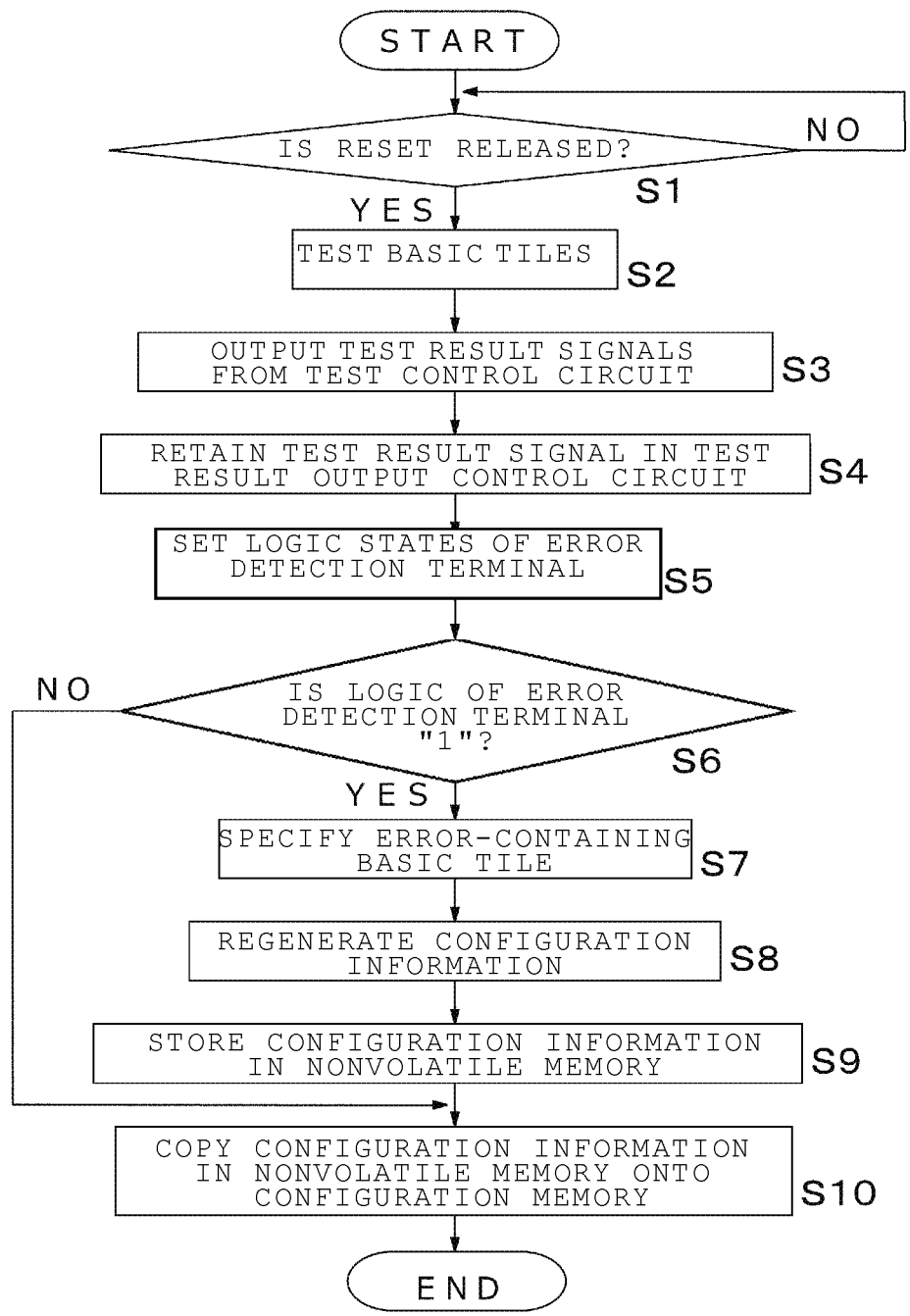

SEMICONDUCTOR INTEGRATED CIRCUIT AND RECONFIGURABLE SEMICONDUCTOR SYSTEM

CROSS-REFERENCE TO RELATED APPLICATIONS

This application is based upon and claims the benefit of priority from Japanese Patent Application No. 2018-173577, filed Sep. 18, 2018, the entire contents of which are incorporated herein by reference.

FIELD

Embodiments described herein relate generally to a semiconductor integrated circuit and a reconfigurable semiconductor system.

BACKGROUND

A Field Programmable Gate Array (FPGA) capable of reconfiguring any logic function is widely used. A large number of reconfigurable logic circuits are provided in the FPGA, and a test is performed before shipping to check whether each logic circuit operates normally. In general, if some logic circuits are determined to have an error, the FPGA is discarded as a defective product. Also, if an error exists in the FPGA that has been mounted on a board, either the FPGA or the whole board needs to be replaced, and the defective board is discarded in the latter case. Such a replacement costs a manufacturer of the board using the FPGA product in terms of time and money.

DESCRIPTION OF THE DRAWINGS

FIG. 3 is a flow chart illustrating a processing operation of the reconfigurable semiconductor system illustrated in FIG. 2.

DETAILED DESCRIPTION

An embodiment provides a semiconductor integrated circuit and a reconfigurable semiconductor system which can perform correction if an error is found in some logic circuits in the semiconductor integrated circuit.

In general, according to one embodiment, a semiconductor integrated circuit includes a plurality of logic circuits each being configurable to perform a logic function according to configuration data set therein, a memory that stores configuration information for use in setting the configuration data in each of the plurality of logic circuits, a test circuit configured to perform a test for detecting an error in each logic circuit, and an output circuit configured to output information indicating whether the error exists in one or more of the logic circuits based on a result of the test. In response to the output of the information indicating that the error exists, the configuration information stored in the memory is updated with new configuration information for setting the configuration data of each of the logic circuits other than one or more logic circuits having the error.

Hereinafter, embodiments of the present disclosure will be described with reference to the drawings. In the following embodiments, characteristic configurations and operations of a semiconductor integrated circuit and a reconfigurable semiconductor system are mainly described. However, the semiconductor integrated circuit and the reconfigurable semiconductor system may have other configurations and operations omitted in the following description.

Figure 1:
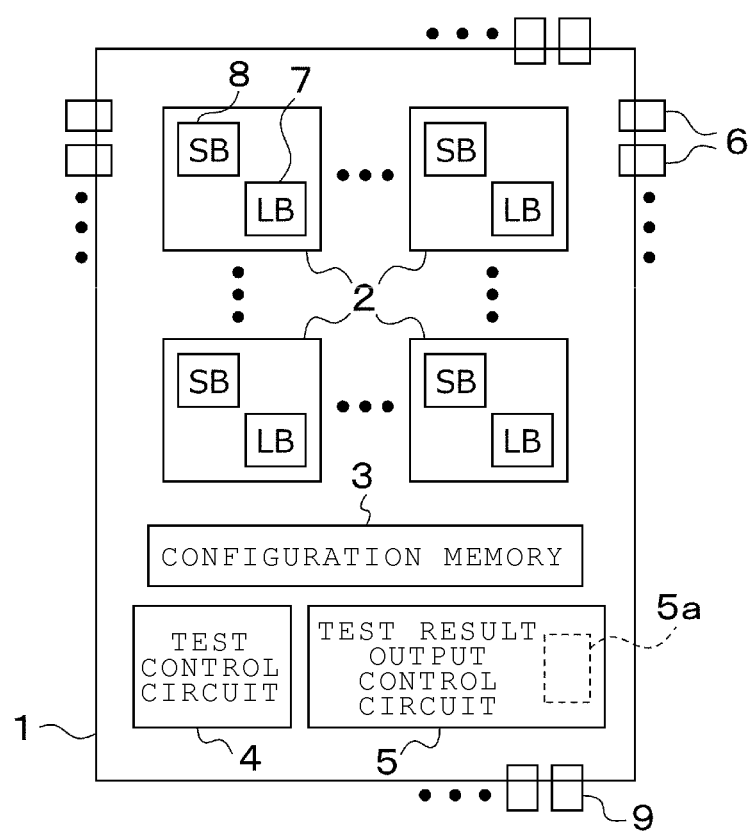
FIG. 1 is a block diagram illustrating an internal configuration of a semiconductor integrated circuit according to one embodiment.

FIG. 1 is a block diagram illustrating an internal configuration of a semiconductor integrated circuit 1 according to one embodiment. The semiconductor integrated circuit 1 illustrated in FIG. 1 has a reconfigurable logic function, and is also called FPGA.

The semiconductor integrated circuit 1 in FIG. 1 includes a plurality of basic tiles 2, a configuration memory 3, a test control circuit 4, a test result output control circuit 5, and a plurality of input/output terminals 6.

Each basic tile 2 has a reconfigurable logic function. In the present specification, the basic tile 2 is also called a logic circuit. Specifically, the basic tile 2 includes a logic block (LB) 7 and a switch block (SB) 8. Alternatively, only the logic block 7 may be provided in the basic tile 2, and a switch block 8 may be provided between the plurality of adjacent basic tiles 2 or in the vicinity of each basic tile 2.

The logic blocks 7 each include a lookup table, an adder, a multiplexer, a flip-flop, and the like. For example, the logic function of each logic block 7 may be switched by changing data registered in the lookup table.

The configuration memory 3 stores configuration information. Based on the configuration information, data is set in the lookup table or the like in the basic tile 2. Therefore, the logic function of each logic block 7 can be switched by updating configuration information to be stored in the configuration memory 3. Similarly, it is possible to switch the items connected to each switch block 8, based on the configuration information in the configuration memory 3. Further, it is possible to change the function of at least part of the input/output terminals 6 depending on the configuration information.

The configuration memory 3 in FIG. 1 may be, for example, a volatile memory such as a static random access memory (SRAM), and the like. When the configuration memory 3 is a volatile memory and the power of the semiconductor integrated circuit 1 is turned off, the data in the volatile memory may be erased. For this reason, it is necessary to write configuration information to the configuration memory 3 from the outside at the time of supply of power to the semiconductor integrated circuit 1 in FIG. 1. After the writing ends, the logic function of each logic block 7 and the switching function of each switch block 8 in each basic tile 2 are set based on the configuration information stored in the configuration memory 3.

When the configuration memory 3 in FIG. 1 is a volatile memory such as an SRAM, it is considered that a nonvolatile memory such as a flash memory is mounted on a board on which the semiconductor integrated circuit 1 in FIG. 1 is to be mounted, and the configuration information in the nonvolatile memory is written into the configuration memory 3 at the time of supply of power to the semiconductor integrated circuit 1 in FIG. 1. Accordingly, whenever power is supplied to the board, the configuration information is automatically written into the configuration memory 3 in the semiconductor integrated circuit 1 in FIG. 1 from the nonvolatile memory on the board, whereby the semiconductor integrated circuit 1 exhibits a desired logic function.

When the configuration memory 3 is a nonvolatile memory such as a magnetic RAM (MRAM), it is not necessary to provide a nonvolatile memory such as a flash memory in the vicinity of the semiconductor integrated circuit 1 in FIG. 1. In this case, even if the power of the semiconductor integrated circuit 1 in FIG. 1 is turned off, the configuration information in the configuration memory 3 remains without being erased. Therefore, the logic function is set for each logic block 7 and the switching function is also set for each switch block 8 using the configuration information in the configuration memory 3 as it is, when the power of the semiconductor integrated circuit 1 in FIG. 1 is resupplied.

Testing the presence or absence of an error in each basic tile 2 is performed by the test control circuit 4. The test control circuit 4 may perform testing after reset is released at the time of supply of power to the semiconductor integrated circuit 1 in FIG. 1, or may perform testing whenever power is supplied for several times. Also, testing may be performed at a timing different from when the power is supplied.

It is desirable that the test control circuit 4 includes, for example, a built-in self-test (BIST) circuit so that the test control circuit 4 can perform testing without being inputted a test pattern from the outside. The BIST circuit inputs to each basic tile 2 the test pattern generated by a pseudo random pattern generator (PRPG), such as a linear feedback shift register (LFSR) and the like, compresses the response from each basic tile 2 using a test response compactor (TRC), and compares them, thereby obtaining a test result. For example, the test control circuit 4 may output test result signals including 1-bit information for each basic tile 2, indicating whether each basic tile 2 has an error. More specifically, bit data "1" may be output if the basic tile 2 has an error and bit data "0" if the basic tile 2 has no error.

The test result output control circuit 5 outputs information on the error-containing basic tile 2 based on the test results obtained from the test control circuit 4. The test result output control circuit 5 may include a register circuit 5a. The register circuit 5a has a function of retaining a plurality of bits of data. As described above, since the test control circuit 4 outputs the test result signals, each indicating whether each basic tile 2 has an error, the register circuit 5a retains the test result signals whose number is the same as the number of the basic tiles 2.

In addition, the test result output control circuit 5 may output an error detection signal as a specific logic state (for example, "1") when at least one basic tile 2 among the plurality of basic tiles 2 has an error. The error detection signal is output from an error detection terminal 9 of the semiconductor integrated circuit 1 in FIG. 1. For example, the error detection signal may be a signal obtained by calculating the logical sum of the plurality of test result signals retained in the register circuit 5a using the OR gate when "1" is set to signify an error.

Figure 2:
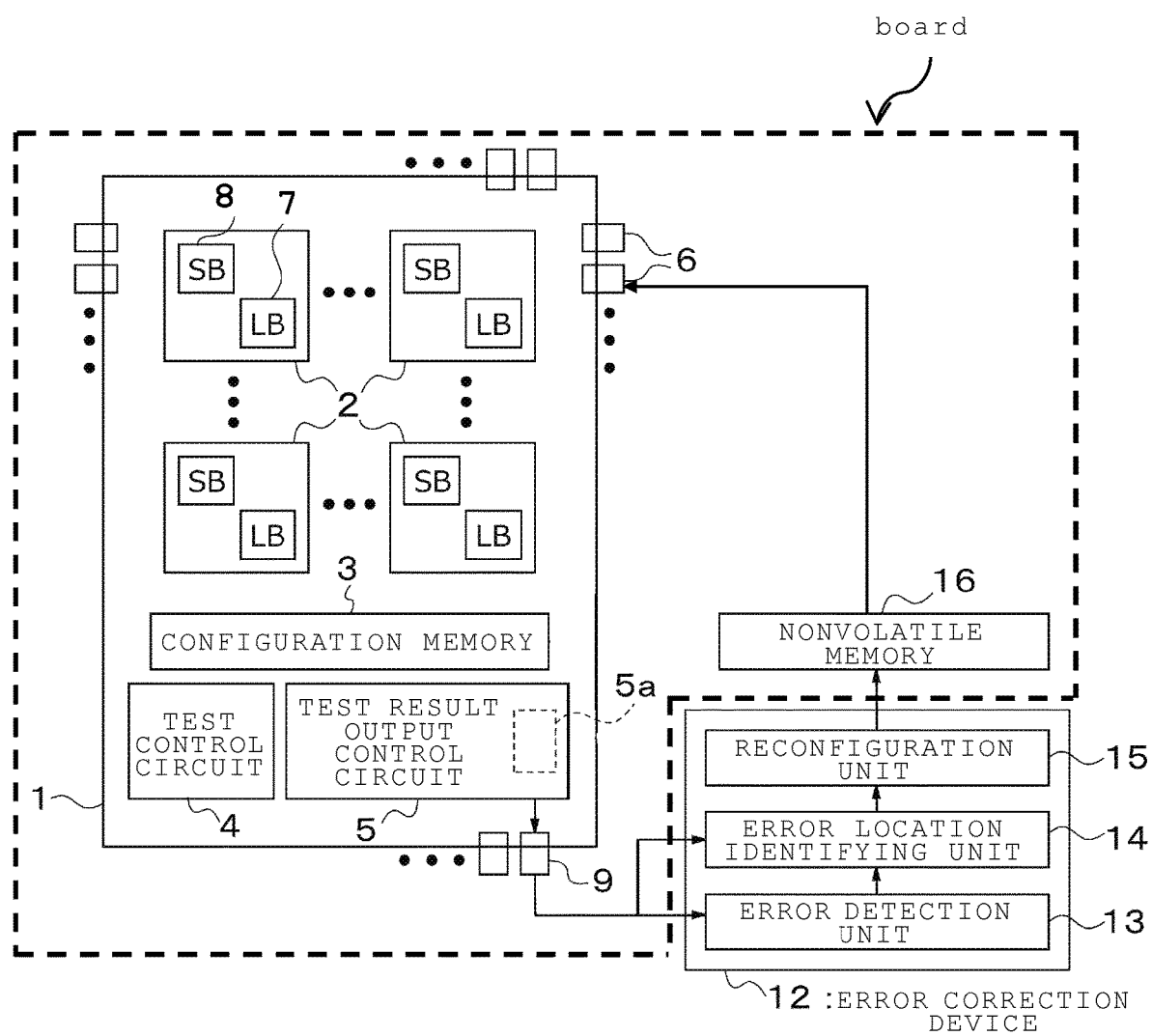
FIG. 2 is a block diagram illustrating a reconfigurable semiconductor system performing correction on a basic tile having an error.

FIG. 2 is a block diagram illustrating an overall configuration of a reconfigurable semiconductor system 11 which performs correction on an error-containing basic tile 2 in the semiconductor integrated circuit 1 in FIG. 1. The reconfigurable semiconductor system 11 in FIG. 2 includes an error correction device 12, in addition to the semiconductor integrated circuit 1.

The error correction device 12 prohibits the error-containing basic tile 2 from being used in the semiconductor integrated circuit 1, and performs error correction, achieving the desired logic function using other basic tiles 2. The error correction device 12 includes an error detection unit 13, an error location identifying unit 14, and a reconfiguration unit 15. Each of the units may be implemented by dedicated hardware such as a circuit. Alternatively, each unit may be implemented by software, executed by a processor and a memory (now shown) installed in the error correction device 12.

The error detection unit 13 monitors whether the error detection terminal 9 of the semiconductor integrated circuit 1 becomes a predetermined logic state (for example, "1"), and detects that at least one of basic tiles 2 in the semiconductor integrated circuit 1 has an error when the predetermined logic state is reached.

When an error is detected by the error detection unit 13, the error location identifying unit 14 accesses the semiconductor integrated circuit 1 to read the data retained by the register circuit 5a in the test result output control circuit 5, thereby specifying the error-containing basic tile 2.

The reconfiguration unit 15 prohibits the error-containing basic tile 2 from being used, and generates configuration information to amend the logic synthesis process and wiring process so that the desired logic function can be achieved by the semiconductor integrated circuit 1 using the other basic tiles 2. The logic function of the semiconductor integrated circuit 1 has a conceptual configuration including the logic function of the logic block 7 and the switching function of the switch block 8.

The logic synthesis process is a process of converting a source code written in hardware description language such as Verilog HDL or VHDL into a circuit element. The arrangement and wiring process is a process of mapping the circuit elements converted by the logic synthesis process to the logic blocks 7 and the switch blocks 8 in addition to a process of wiring the circuit elements.

Configuration information generated by the reconfiguration unit 15 is stored in a nonvolatile memory 16 such as a flash memory, which is mounted on a board together with the semiconductor integrated circuit 1. The configuration information stored in the nonvolatile memory 16 is stored in the configuration memory 3 at the time of supply of power to the semiconductor integrated circuit 1, or the like. However, in a case where the configuration memory 3 in the semiconductor integrated circuit 1 is a nonvolatile memory, the reconfiguration unit 15 of the error correction device 12 may write the configuration information directly into the configuration memory 3.

The error correction device 12 in FIG. 2 can perform the above-described test operations even after shipping the semiconductor integrated circuit 1.

FIG. 3 is a flowchart illustrating a processing operation of the reconfigurable semiconductor system 11 illustrated in FIG. 2. After shipment of the semiconductor integrated circuit 1 in FIG. 1, the semiconductor integrated circuit 1 and the nonvolatile memory 16 are mounted on a board, and this flowchart is carried out when power is supplied to the board (i.e., the board in FIG. 2 on which the semiconductor integrated circuit 1 and the nonvolatile memory 16 are mounted). When executing the processing in the flowchart in FIG. 3, it is necessary to connect, in advance, the error correction device 12 with the error detection terminal 9 and the input/output terminals 6 of the semiconductor integrated circuit 1 to be inspected.

First, it is determined whether the reset state of the semiconductor integrated circuit 1 has been released (Step S1). If the reset state has been released, the test control circuit 4 tests whether each basic tile 2 has an error (Step S2). The test control circuit 4 determines that there is an error when various defects occur, such as short-circuited or disconnected wiring in a logic block 7 or switch block 8 in a basic tile 2, and delayed signals or inverted logic states caused by noise due to the electrical characteristics of a circuit element of the logic blocks 7 or the switch blocks 8 not satisfying a predetermined standard.

When it is determined that any basic tile 2 has an error, the test control circuit 4 sets the test result signal for the basic tile 2 at the first logic state (for example, "1"). When it is determined that there is no error, the test result signal is set to the second logic state (for example, "0") (Step S3).

The test result output control circuit 5 retains the test result signal output from the test control circuit 4 (Step S4). Specifically, since the test control circuit 4 outputs a 1-bit test result signal for each basic tile 2, the test result output control circuit 5 retains a test result signal consisting of a data bit string whose length is the number of all the basic tiles 2 in the register circuit 5a.

The bit string data retained by the register circuit 5a is input into the OR gate, for example, and the output of the OR gate is input to the error detection terminal 9 of the semiconductor integrated circuit 1 in FIG. 1. As a result, when at least one basic tile 2 has an error, the output of the OR gate becomes "high", and the error detection terminal 9 also outputs "high" (Step S5).

The error correction device 12 monitors whether the error detection terminal 9 has logic state "1" (Step S6). When the error detection terminal 9 has logic state "1", the error correction device 12 accesses the semiconductor integrated circuit 1 in FIG. 1 to check which bit in the data bit string retained in the register circuit 5a in the test result output control circuit 5 is "1". As a result, the error correction device 12 identifies the error-containing basic tile 2 (Step S7).

Next, the error correction device 12 prohibits the error-containing basic tile 2 from being used, redesigns the logic function of the basic tiles 2 so that the logic function originally intended in the semiconductor integrated circuit 1 in FIG. 1 can be achieved using the other basic tiles 2, and generates the corresponding configuration information (Step S8). Subsequently, the error correction device 12 stores the generated configuration information in the nonvolatile memory 16 such as a flash memory (Step S9).

When it is determined in Step S6 that the error detection terminal 9 has a logic value of "0", or when the processing in Step S9 is ended, the configuration information stored in the nonvolatile memory 16 is copied onto the configuration memory 3 in the semiconductor integrated circuit 1 in FIG. 1 (Step S10).

In this embodiment, inside the semiconductor integrated circuit 1, the presence or absence of an error in each basic tile 2 is tested, the test result is retained, and the fact that any one of the basic tiles 2 has an error is output to the outside. Therefore, the error correction device 12 can easily detect that the semiconductor integrated circuit 1 has an error. When any basic tile 2 has an error, it is possible to identify the error-containing basic tile 2 by accessing the test result output control circuit 5 in the semiconductor integrated circuit 1 from the error correction device 12. Thereby, the error correction device 12 can generate configuration information to achieve the desired logic function using the remaining basic tiles 2 while prohibiting the error-containing basic tile 2 from being used. By storing the configuration information in the configuration memory 3 in the semiconductor integrated circuit 1 illustrated in FIG. 1, it is possible to continue to use the semiconductor integrated circuit 1 in FIG. 1 even when there is an error-containing basic tile 2, whereby yield of the semiconductor integrated circuit 1 can be improved.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor integrated circuit comprising:
    a plurality of logic circuits each being configurable to perform a logic function according to configuration data set therein;
    a memory that stores first configuration information, wherein the first configuration information is used in setting the configuration data in each of the plurality of logic circuits;
    a test circuit configured to perform a test for detecting an error in each logic circuit; and
    an output circuit configured to output information indicating whether the error exists in one or more of the logic circuits based on a result of the test, wherein
    in response to the output of the information indicating that the error exists, the first configuration information stored in the memory is updated to second configuration information, wherein the second configuration information is used in setting the configuration data of each of the logic circuits other than one or more logic circuits having the error and is not used in setting the configuration data of the one or more logic circuits having the error.

2. The semiconductor integrated circuit according to claim 1, wherein
    the second configuration information is generated by an error correction device connected to the semiconductor integrated circuit, based on the information output by the output circuit.

3. The semiconductor integrated circuit according to claim 1, wherein
    in response to a start of power supply to the semiconductor integrated circuit, the test circuit performs the test and the output circuit generates the information indicating whether the error exists.

4. The semiconductor integrated circuit according to claim 1, wherein
    the output circuit includes a register circuit configured to store a plurality of test result signals indicating whether the error exists in the logic circuits.

5. The semiconductor integrated circuit according to claim 1, further comprising:
    a terminal connected to the output circuit, wherein
    the output circuit supplies to the terminal a signal indicating either a first state where the error exists in one or more of the logic circuits or a second state where the error does not exist in any logic circuit.

6. The semiconductor integrated circuit according to claim 5, wherein
    the signal supplied to the terminal is transmitted to an error correction device configured to generate the second configuration information based on the signal.

7. The semiconductor integrated circuit according to claim 1, wherein
    the memory is a volatile memory, and in response to a start of power supply to the semiconductor integrated circuit, the first configuration information is copied from an external memory to the volatile memory.

8. The semiconductor integrated circuit according to claim 1, wherein
each logic circuit corresponds to a field-programmable gate array (FPGA) logic tile comprising at least a logic block and a switch block.

9. The semiconductor integrated circuit according to claim 8,
the logic block stores the configuration data.

10. The semiconductor integrated circuit according to claim 1, wherein
the test circuit comprises a build-in self-test circuit configured to generate a test pattern for testing each logic circuit.

11. A semiconductor system comprising:
a semiconductor integrated circuit; and
an error correction device configured to correct an error of the semiconductor integrated circuit, wherein
the semiconductor integrated circuit includes:
    a plurality of logic circuits each being configurable to perform a logic function according to configuration data set therein,
    a first memory that stores first configuration information, wherein the first configuration information is used in setting the configuration data in each of the plurality of logic circuits,
    a test circuit configured to perform a test for detecting an error in each logic circuit, and
    an output circuit configured to output information indicating whether the error exists in one or more of the logic circuits based on a result of the test, and
in response to the output of the information indicating that the error exists, the error correction device
    generates, based on the information output by the output circuit, second configuration information that is used in setting the configuration data of each of the logic circuits other than one or more logic circuits having the error and is not used in setting the configuration data of the one or more logic circuits having the error, and
    outputs the generated second configuration information to be used by the semiconductor integrated circuit.

12. The semiconductor system according to claim 11, further comprising:
a second memory that stores the second configuration information output by the error correction device, wherein
in response to a start of power supply to the semiconductor integrated circuit, the second configuration information is copied from the second memory to the first memory.

13. The semiconductor system according to claim 12, wherein
the first and second memories are volatile and nonvolatile memories, respectively.

14. The semiconductor system according to claim 11, wherein
a terminal connected to the output circuit, wherein
the output circuit supplies to the terminal a signal indicating either a first logic state where the error exists in one or more of the logic circuits or a second logic state where the error does not exist in any logic circuit.

15. The semiconductor system according to claim 14, wherein
in response to a start of power supply to the semiconductor integrated circuit, the test circuit performs the test and the output circuit supplies the signal to the error correction device through the terminal.

16. The semiconductor system according to claim 15, wherein
the error correction device is configured to identify the one or more logical circuits having the error based on the signal received through the terminal.

17. The semiconductor system according to claim 11, wherein
each logic circuit is an FPGA logic tile comprising a logic block and a switch block.

18. The semiconductor system according to claim 17,
the logic block stores the configuration data.

19. The semiconductor system according to claim 11, wherein
the test circuit comprises a build-in self-test circuit configured to generate a test pattern for testing each logic circuit.

20. A semiconductor board comprising:
a first memory that stores first configuration information; and
a semiconductor integrated circuit comprises:
    a plurality of logic circuits each being configurable to perform a logic function according to configuration data set therein,
    a second memory that stores the first configuration information, which is copied from the first memory in response to a start of power supply to the integrated circuit, wherein the first configuration information is used in setting the configuration data in each of the plurality of logic circuits,
    a test circuit configured to perform a test for detecting an error in each logic circuit, and
    an output circuit configured to output information indicating whether the error exists in one or more of the logic circuits based on a result of the test, wherein
in response to the output of the information indicating that the error exists, the first configuration information stored in the first memory is updated to second configuration information, wherein the second configuration information is used in setting the configuration data of each of the logic circuits other than one or more logic circuits having the error and is not used in setting the configuration data of the one or more logic circuits having the error.

* * * * *